United States Patent
Schiek et al.

(10) Patent No.: US 12,506,459 B2
(45) Date of Patent: Dec. 23, 2025

(54) BULK ACOUSTIC WAVE (BAW) DEVICE WITH OPPOSITELY POLARIZED PIEZOELECTRIC LAYERS FOR HIGHER ORDER RESONANCE AND METHOD OF MANUFACTURE

(71) Applicant: RF360 Singapore Pte. Ltd., Singapore (SG)

(72) Inventors: Maximilian Schiek, Puchheim (DE); Willi Aigner, Moosinning (DE); Christian Ceranski, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 460 days.

(21) Appl. No.: 17/934,291

(22) Filed: Sep. 22, 2022

(65) Prior Publication Data
US 2024/0106408 A1 Mar. 28, 2024

(51) Int. Cl.
*H03H 9/02* (2006.01)
*H03H 3/02* (2006.01)
*H03H 9/17* (2006.01)

(52) U.S. Cl.
CPC .......... *H03H 9/02015* (2013.01); *H03H 3/02* (2013.01); *H03H 9/174* (2013.01);
(Continued)

(58) Field of Classification Search
CPC ..... H03H 9/02015; H03H 9/174; H03H 9/175
See application file for complete search history.

(56) References Cited

U.S. PATENT DOCUMENTS 7,758,979 B2 7/2010 Akiyama et al.
9,065,421 B2 6/2015 Feng et al.
(Continued)

FOREIGN PATENT DOCUMENTS

JP 2007036915 A 2/2007
WO 2021241696 A1 12/2021

OTHER PUBLICATIONS

Kawasaki O., et al., "Variable Property Crystal Resonators by Direct Bonding Techniques," 1996 IEEE Ultrasonics Symposium, Proceedings, vol. 2, Jan. 1, 1996, pp. 897-900, XP093034250, pp. 897, 899, figures 1, 3.
Invitation to Pay Additional Fees and Partial International Search for International Patent Application No. PCT/SG2023/050627, mailed Jan. 9, 2024, 10 pages.
(Continued)

*Primary Examiner* — Samuel S Outten
(74) *Attorney, Agent, or Firm* — W&T

(57) ABSTRACT

A bulk acoustic wave (BAW) device comprises a layer stack including first and second electrodes, a first piezoelectric layer between the electrodes, and a second piezoelectric layer between the first piezoelectric layer and the second electrode. A polarization of a crystal structure of the second piezoelectric layer is opposite to a polarization of a crystal structure of the first piezoelectric layer to achieve higher order resonant frequencies in the BAW device by means other than merely thinning layers in the layer stack. In some examples, the BAW device is a two-terminal device and does not include a metal layer configured to be a third electrode. In some examples, the BAW device includes at least one intermediate layer between the first and second piezoelectric layers, and a total combined thickness of the at least one intermediate layer is less than 4% of a total thickness of the layer stack.

32 Claims, 12 Drawing Sheets

(52) U.S. Cl.
CPC ....... *H03H 9/175* (2013.01); *H03H 2003/023* (2013.01); *H03H 2003/025* (2013.01)

(56) References Cited

U.S. PATENT DOCUMENTS

| | | |
|---|---|---|
| 9,847,768 B2 | 12/2017 | Grannen et al. |
| 10,320,361 B2 | 6/2019 | Meltaus et al. |
| 2005/0012568 A1 | 1/2005 | Aigner et al. |
| 2014/0246305 A1 | 9/2014 | Larson, III |
| 2015/0280687 A1* | 10/2015 | Burak .................. H03H 9/175 310/321 |
| 2018/0085787 A1 | 3/2018 | Burak et al. |
| 2020/0412299 A1* | 12/2020 | Kurokawa ............ H03H 9/131 |
| 2021/0006220 A1 | 1/2021 | Schiek et al. |
| 2021/0036678 A1* | 2/2021 | Burak .................. H03H 9/131 |
| 2021/0408996 A1 | 12/2021 | Ylilammi et al. |

OTHER PUBLICATIONS

International Search Report and Written Opinion for or International Patent Application No. PCT/SG2023/050627, mailed Apr. 17, 2024, 21 pages.

Allah, M.A. et al., "Temperature compensated solidly mounted bulk acoustic wave resonators with optimum piezoelectric coupling coefficient," 2009 IEEE International Electron Devices Meeting (IEDM), Dec. 7-9, 2009, Baltimore, MD, USA, IEEE, 4 pages.

\* cited by examiner

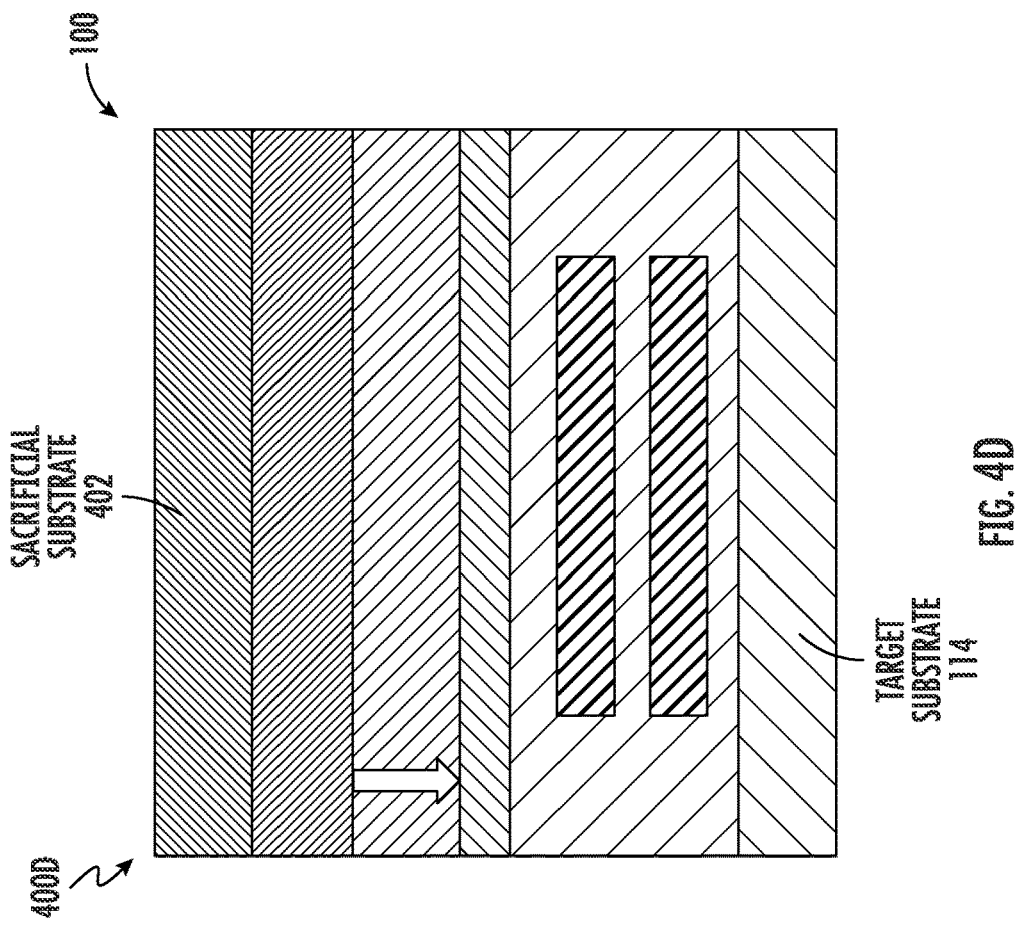

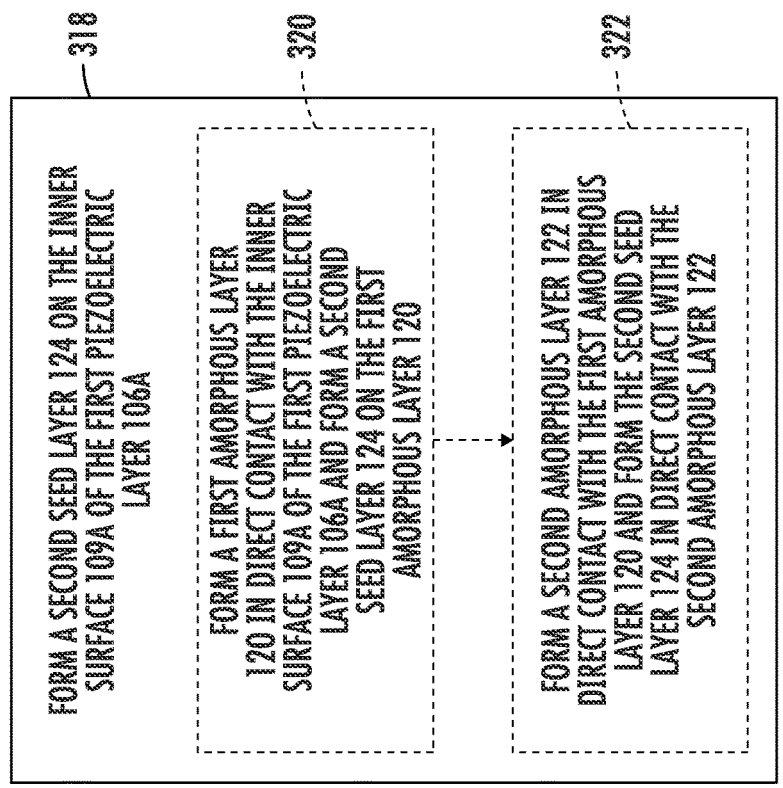
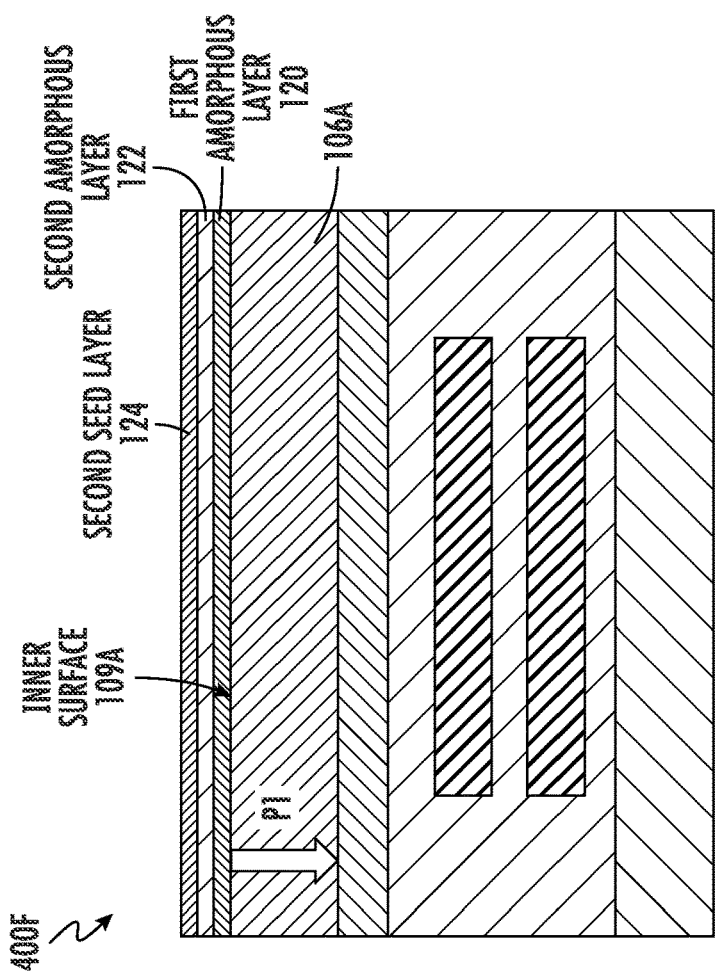

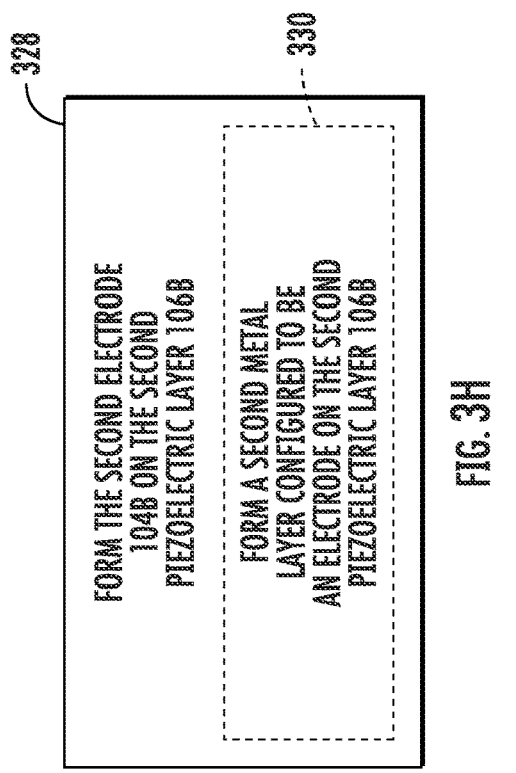
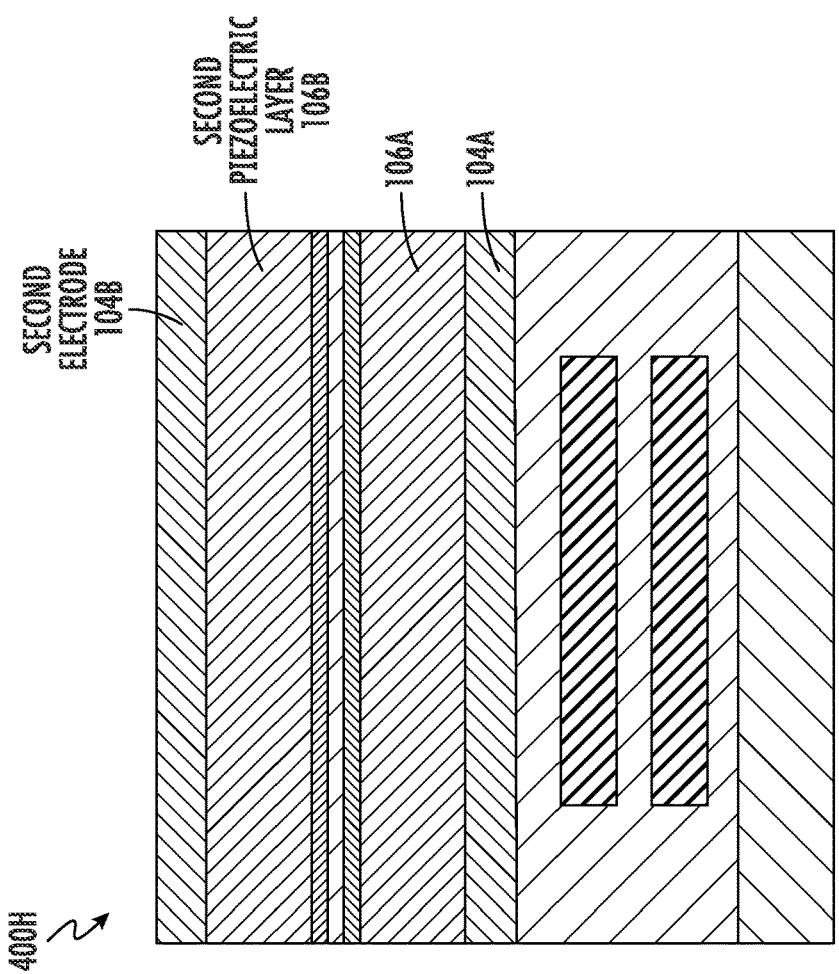

BULK ACOUSTIC WAVE (BAW) DEVICE WITH OPPOSITELY POLARIZED PIEZOELECTRIC LAYERS FOR HIGHER ORDER RESONANCE AND METHOD OF MANUFACTURE

BACKGROUND

I. Field of the Disclosure

The technology of the disclosure relates generally to micro-acoustic devices and, more particularly, to bulk acoustic wave (BAW) resonators for higher frequency BAW filters.

II. Background

Wireless devices, such as cellular telephones, communicate by transmitting and receiving wireless signals through the air. Cellular telephones, for example, transmit and receive wireless signals in limited ranges of radio frequencies, and those ranges vary depending on the geographical region (e.g., country) of the world. Thus, worldwide, wireless devices such as cellular telephones need to include filters for passing frequencies of radio-frequency (RF) signals within certain ranges while blocking others.

Micro-acoustic filters employ surface acoustic wave (SAW) resonators or bulk acoustic wave (BAW) resonators to filter frequencies transmitted and received by a wireless device. Micro-acoustic filters convert an input RF signal into acoustic waves, filter the acoustic waves, and convert the filtered acoustic waves into an output RF signal. The input RF signal is provided to electrodes that are separated by a layer of piezoelectric material that expands and contracts in response to the input RF signal to create the acoustic waves. The frequencies of acoustic waves that resonate in a layer stack of a BAW device are inversely related to the combined thicknesses of the electrodes and the piezoelectric layer. As cellular technologies advance from 5G to 6G and 7G, the frequencies of operation will be above 10 GHz. Thus, the frequencies that are filtered by a micro-acoustic resonator will increase, and, using conventional BAW devices, the electrodes and piezoelectric layers will have to continue getting thinner. However, as the layers become thinner, ohmic losses and power density increase, breakdown voltages decrease, and manufacturability becomes more challenging. Thus, to achieve 6G and 7G operation frequencies, a BAW device is needed that can operate at such frequencies without significantly thinning the electrode layers and the piezoelectric layer(s) of a layer stack.

SUMMARY

Aspects disclosed herein include bulk acoustic wave (BAW) devices with oppositely polarized piezoelectric layers for higher-order resonance. Methods of fabricating BAW devices with oppositely polarized piezoelectric layers are also disclosed. In exemplary aspects, a layer stack of an exemplary BAW device includes a first layer of a piezoelectric material ("first piezoelectric layer") and a second layer of a piezoelectric material ("second piezoelectric layer") adjacent to the first piezoelectric layer. The second piezoelectric layer has a crystal structure with a polarization that is opposite to a polarization of the crystal structure of the first piezoelectric layer. In exemplary aspects, the oppositely polarized crystal structures in the first and second piezoelectric layers enable resonance in a higher order mode to operate at higher frequencies without thinning the layers in the layer stack.

In some examples, the BAW device is a two-terminal device. In this regard, the BAW device has a first electrode adjacent to the first piezoelectric layer and a second electrode adjacent to the second piezoelectric layer. In one example, the first and second electrodes are adjacent to outer surfaces of the respective first and second piezoelectric layers. The first and the second electrodes are configured to couple to first and second terminals. Application of a voltage differential between the first and second terminals creates an electric field in the layer stack of the BAW device that causes opposite responses (e.g., expansion and contraction) in the first piezoelectric layer and the second piezoelectric layer, canceling out first order resonance and enabling second order resonance. In another exemplary aspect, the layer stack of the BAW device does not include, between the first piezoelectric layer and the second piezoelectric layer, a third electrode configured to couple to a third terminal. In this example, the layer stack of the BAW device is employed as a single resonant cavity between the first and second electrodes rather than as two resonant cavities, which would be operated using a third electrode.

In other examples, the layer stack of the BAW device includes one or more intermediate layers disposed between the first piezoelectric layer and the second piezoelectric layer. The one or more intermediate layers can include at least one amorphous layer to reduce transfer of crystal structure information from the first piezoelectric layer during formation of the second piezoelectric layer to enable formation of a crystal structure in the second piezoelectric layer with a polarization opposite to the first piezoelectric layer. For example, a distance between the first piezoelectric layer and the second piezoelectric layer is less than four percent (4%) of the thickness of the layer stack. In this manner, adding one or more intermediate layers enables the formation of the opposite crystal structure of the second piezoelectric layer while minimizing an increase in thickness of the layer stack to avoid reduction of the resonant frequency.

In this regard, in one aspect, a two-terminal BAW device is disclosed. The two-terminal BAW device comprises a layer stack comprising a first electrode configured to couple to a first terminal and a second electrode configured to couple to a second terminal. The layer stack further comprises a first piezoelectric layer between the first electrode and the second electrode, the first piezoelectric layer comprising a first crystalline structure having a first polarization, and a second piezoelectric layer between the first piezoelectric layer and the second electrode, the second piezoelectric layer comprising a second crystalline structure having a second polarization opposite to the first polarization.

In another aspect, a BAW device comprising a layer stack is disclosed. The layer stack comprises a first electrode, a second electrode, and a first piezoelectric layer between the first electrode and the second electrode, the first piezoelectric layer comprising a first crystalline structure having a first polarization. The layer stack also comprises a second piezoelectric layer between the first piezoelectric layer and the second electrode, the second piezoelectric layer comprising a second crystalline structure having a second polarization opposite to the first polarization. The layer stack further comprises at least one intermediate layer between the first piezoelectric layer and the second piezoelectric layer, wherein a distance between the first piezoelectric layer and the second piezoelectric layer is less than four percent (4%) of a total thickness of the layer stack.

In another aspect, a two-terminal BAW device is disclosed. The two-terminal BAW device comprises a layer stack. The layer stack comprises a first means for receiving a first voltage, a second means for receiving a second voltage, and a first crystal means having a first polarization and disposed between the first means for receiving the first voltage and the second means for receiving the second voltage. The layer stack also comprises a second crystal means having a second polarization opposite to the first polarization and disposed between the first crystal means and the second means for receiving the second voltage. A difference between the first voltage and the second voltage excites an acoustic wave in the first crystal means and the second crystal means.

In another aspect, a BAW device is disclosed. The BAW device comprises a layer stack. The layer stack comprises a first means for receiving a first voltage, a second means for receiving a second voltage, and a first crystal means having a first polarization and disposed between the first means for receiving the first voltage and the second means for receiving the second voltage. The layer stack comprises a second crystal means having a second polarization opposite to the first polarization and disposed between the first crystal means and the second means for receiving the second voltage, and at least one intermediate means between the first crystal means and the second crystal means. A distance between the first crystal means and the second crystal means is less than four percent (4%) of a total thickness of the layer stack.

In another exemplary aspect, a method of fabricating a two-terminal BAW device is disclosed. The method comprises forming a layer stack comprising a first electrode configured to couple to a first terminal and a second electrode configured to couple to a second terminal. The layer stack further comprises a first piezoelectric layer between the first electrode and the second electrode, the first piezoelectric layer comprising a piezoelectric material having a first crystalline structure having a first polarization; and a second piezoelectric layer between the first piezoelectric layer and the second electrode, the second piezoelectric layer comprising the piezoelectric material having a second crystalline structure having a second polarization opposite to the first polarization.

BRIEF DESCRIPTION OF THE DRAWINGS

FIGS. 3A-3H are a detailed flowchart of an exemplary method of fabricating the BAW device in FIG. 1, corresponding to the stages in FIGS. 4A-4H;

FIGS. 4A-4H are illustrations of cross-sections of the BAW device in FIG. 1, during stages of fabrication;

DETAILED DESCRIPTION

Figure 1:
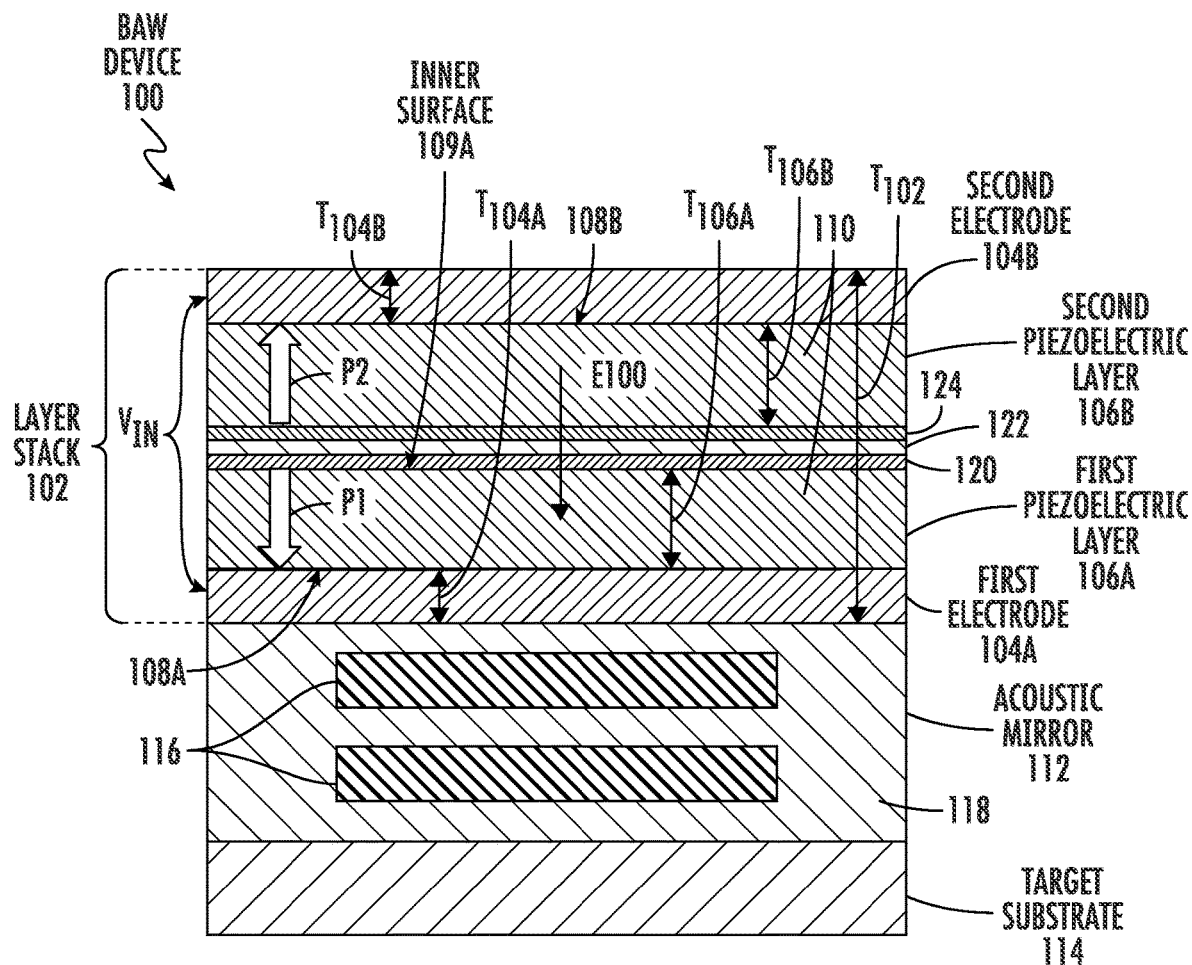
FIG. 1 is an illustration of a cross-section of an exemplary bulk acoustic wave (BAW) device in a solidly mounted resonator (SMR) example in which a layer stack includes a first piezoelectric layer and a second piezoelectric layer having opposite crystal polarization for higher order operation.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include bulk acoustic wave (BAW) devices with oppositely polarized piezoelectric layers for higher-order resonance. Methods of fabricating BAW devices with oppositely polarized piezoelectric layers are also disclosed. In exemplary aspects, a layer stack of an exemplary BAW device includes a first layer of a piezoelectric material ("first piezoelectric layer") and a second layer of a piezoelectric material ("second piezoelectric layer") adjacent to the first piezoelectric layer. The second piezoelectric layer has a crystal structure with a polarization that is opposite to a polarization of the crystal structure of the first piezoelectric layer. In exemplary aspects, the oppositely polarized crystal structures in the first and second piezoelectric layers enable resonance in a higher order mode to operate at higher frequencies without thinning the layers in the layer stack.

In some examples, the BAW device is a two-terminal device. In this regard, the BAW device has a first electrode adjacent to the first piezoelectric layer and a second electrode adjacent to the second piezoelectric layer. In one example, the first and second electrodes are adjacent to outer surfaces of the respective first and second piezoelectric layers. The first and the second electrodes are configured to couple to the first and second terminals. Application of a voltage differential between the first and second terminals creates an electric field in the layer stack of the BAW device that causes opposite responses (e.g., expansion and contraction) in the first piezoelectric layer and the second piezoelectric layer, canceling out first order resonance and enabling second order resonance. In another exemplary aspect, the layer stack of the BAW device does not include, between the first piezoelectric layer and the second piezoelectric layer, a third electrode configured to couple to a third terminal. In this example, the layer stack of the BAW device is employed as a single resonant cavity between the first and second electrodes rather than as two resonant cavities, which would be operated using a third electrode.

In other examples, the layer stack of the BAW device includes one or more intermediate layers disposed between the first piezoelectric layer and the second piezoelectric layer. The one or more intermediate layers can include at least one amorphous layer to reduce transfer of crystal structure information from the first piezoelectric layer during formation of the second piezoelectric layer to enable formation of a crystal structure in the second piezoelectric layer with a polarization opposite to the first piezoelectric layer. For example, a distance between the first piezoelectric layer and the second piezoelectric layer is less than four percent (4%) of the thickness of the layer stack. In this manner, adding one or more intermediate layers enables the formation of the opposite crystal structure of the second piezoelectric layer while minimizing an increase in thickness of the layer stack to avoid reduction of the resonant frequency.

The term "BAW devices," as used herein, includes BAW resonators and BAW filters that employ BAW resonators. An exemplary BAW resonator 100 ("BAW device 100") shown in FIG. 1 includes a layer stack 102 configured to resonate in a high order mode in response to a radio frequency (RF) input signal providing an oscillating voltage $V_{IN}$ between a first electrode 104A and a second electrode 104B of the layer stack 102. The oscillating voltage $V_{IN}$ creates a varying electric field E100 in the layer stack 102. The layer stack 102 includes a first piezoelectric layer 106A and a second piezoelectric layer 106B, which are layers of a piezoelectric material that expands and contracts in response to the electric field E100. The first piezoelectric layer 106A is between the first and second electrodes 104A and 104B, and the second piezoelectric layer 106B is between the first piezoelectric layer 106A and the second electrode 104B. Thus, the electric field E100 between the first and second electrodes 104A and 104B is applied to both the first and second piezoelectric layers 106A and 106B, causing them to expand and contract in response to the oscillating voltage $V_{IN}$, creating acoustic waves in the layer stack 102.

The first and second electrodes 104A and 104B, are layers of a conductive metal (e.g., molybdenum (Mo)) to which the voltage $V_{IN}$ is applied. The first and second electrodes 104A and 104B are on outer surfaces 108A and 108B of the piezoelectric layers 106A and 106B, respectively. The first and second electrodes 104A and 104B are configured to couple to a first terminal (not shown) and a second terminal (not shown), respectively, to receive the voltage $V_{IN}$. In some examples, the first and second electrodes 104A and 104B may be the first terminal and the second terminal. The first and second electrodes 104A and 104B have sufficient thickness to minimize ohmic losses, avoid high power density, and maintain a high Q value in the BAW device 100. A metal layer configured to be an electrode in a BAW resonator has a thickness of at least 15 nanometers (nm). For example, the first electrode 104A may be in the range of 50-150 nm thick, and more particularly about 100 nm, and the first piezoelectric layer 106A is in the range of 200-300 nm thick, and more particularly about 255 nm. First and second electrodes 104A and 104B having a greater thickness, also improves heat dissipation from the first and second piezoelectric layers 106A and 106B. A metal layer configured to be an electrode in a BAW device is also configured to couple to a terminal, wherein the metal layer comprises a lateral region configured to couple to a thicker metal region, an input/output (I/O) pad, a vertical interconnect access (via), or to a trace coupled to another component.

Some conventional BAW filters having multiple piezoelectric layers include a third (middle) electrode between the piezoelectric layers to control the piezoelectric layers separately or to work in conjunction with electrodes on the outer surfaces (e.g., corresponding to outer surfaces 108A and 108B) to cooperatively control oscillation of the entire layer stack. However, layer stack 102 in the BAW device 100 does not include a metal layer configured to couple to an electrode and a third terminal because the BAW device 100 is a two-terminal BAW device. In other words, the voltage $V_{IN}$ applied to the first and second electrodes 104A and 104B is the only RF signal applied to control the BAW device 100, and there is no third electrode through which another electrical signal is received in the BAW device 100.

The first and second piezoelectric layers 106A and 106B may be designed to operate in similar but complementary manners to achieve higher-order resonance in layer stack 102. To this end, the first piezoelectric layer 106A and the second piezoelectric layer 106B may be formed of a same piezoelectric material 110 (e.g., aluminum scandium nitride (AlScN), in particular AlSc30N, or other piezoelectric materials may be used additionally or alternatively). In another aspect, a thickness $T_{106A}$ of the first piezoelectric layer 106A may be the same as a thickness $T_{106B}$ of the second piezoelectric layer 106B. Alternatively, the thickness $T_{106B}$ of the second piezoelectric layer 106B may be in a range from 90% to 110% of the thickness $T_{106A}$ of the first piezoelectric layer 106A, such that the first and second piezoelectric layers 106A and 106B have resonant frequency ranges that are similar or overlapping each other. The thicknesses $T_{106A}$ and $T_{106B}$ are measured in a direction corresponding to a thickness $T_{102}$ of the layer stack 102. The thickness $T_{102}$ of the layer stack 102 includes the thicknesses $T_{106A}$ and $T_{106B}$ of the first and second piezoelectric layers 106A and 106B, the thickness $T_{104A}$ of the first electrode 104A, and the thickness $T_{104B}$ of the second electrode 104B.

Although the first and second piezoelectric layers 106A and 106B may be formed of a same piezoelectric material 110 and may have a same or similar thicknesses $T_{106A}$ and $T_{106B}$, the second piezoelectric layer 106B has a crystal polarization P2 that is in a direction opposite to a crystal polarization P1 of the first piezoelectric layer 106A. In detail, the piezoelectric material 110 of the first and second piezoelectric layers 106A and 106B is formed (e.g., grown) in a crystal lattice structure in which the atoms are oriented in a certain direction, which is referred to as polarization. As explained in more detail below, the polarizations P1 and P2 of the first and second piezoelectric layers 106A and 106B are made opposite to each other, which includes growing the piezoelectric material 110 of the second piezoelectric layer 106B on the first piezoelectric layer 106A.

Opposite polarization of the first and second piezoelectric layers 106A and 106B causes them to have equal responses to the electric field E100 but in opposite directions. In a device having two piezoelectric layers (106A and 106B) that expand and contract individually, the fundamental (first order) mode of operation is not well supported. However, the responses of the two piezoelectric layers (106A and 106B), which are equal in magnitude due to having the same thickness, are compatible with resonance in a higher order mode at double the fundamental resonant frequency. The frequencies at which BAW devices typically resonate in a fundamental mode have wavelengths that are twice as long as an acoustic cavity length of the layer stack 102. In the higher order mode, such as the second harmonic in which the resonant frequency is doubled, the resonant frequency wavelengths are the same or approximately the same as the acoustic cavity length. An acoustic cavity length of the layer stack 102 in the BAW device 100 is based on acoustic velocities of the metals of which the first and second electrodes 104A and 104B are formed, the piezoelectric material 110 of which the first and second piezoelectric layers 106A and 106B are formed, and the respective thicknesses (e.g., $T_{104A}$, $T_{104B}$, $T_{106A}$, and $T_{106B}$) of the layers of the layer stack 102. An acoustic cavity length may also be described in terms of respective acoustic impedances of the layers of layer stack 102.

The expansion and contraction of the first and second piezoelectric layers 106A and 106B, in an (approximately) equal and opposite manner, causes them to cancel each other out. Achieving such behavior can include forming the second piezoelectric layer 106B to have a same crystal structure of a same piezoelectric material 110 grown under the same conditions to a same thickness but with opposite polarization with respect to the first piezoelectric layer 106A. However, achieving such behavior may also be possible by forming the second piezoelectric layer 106B of a different piezoelectric material 110, which may have a different thickness, but still with opposite polarization, to achieve the desired equal but opposite response to the electric field. The piezoelectric material 110 and thickness in such example may be selected based on acoustic velocity, which affects the acoustic cavity length.

The BAW device 100 in FIG. 1 is an example in which the layer stack 102 is employed in a solidly mounted resonator (SMR). In this regard, the layer stack 102 is coupled to or mounted on an acoustic mirror 112 (e.g., Bragg mirror), which is further coupled to a target substrate 114. The acoustic mirror 112 includes high acoustic impedance layers 116, such as tungsten (W), within an amorphous layer 118 having a lower acoustic impedance than the acoustic impedance layers 116. For example, the amorphous layer 118 may be silicon dioxide ($SiO_2$). The target substrate 114 may be any suitable material, such as glass or silicon.

The layer stack 102 in FIG. 1 may also include one or more intermediate layers 120, 122, and 124 between the first piezoelectric layer 106A and the second piezoelectric layer 106B. Alternatively, a BAW device, as disclosed herein, may have no intermediate layers.

As will be described with reference to fabrication stages 400A-400H in FIGS. 4A-4H, the one or more intermediate layers 120, 122, and 124 are residual layers used for fabricating the second piezoelectric layer 106B with desired polarization on the first piezoelectric layer 106A. To fabricate the layer stack 102 such that the second piezoelectric layer 106B has an opposite crystal polarization P2 to the polarization P1 of the first piezoelectric layer 106A, the first piezoelectric layer 106A is first grown in certain conditions on the target substrate 114 according to the method 300. Subsequently, the conditions for growing the first piezoelectric layer 106A may be reproduced for growing the second piezoelectric layer 106B on the first piezoelectric layer 106A.

When growing a crystal lattice structure (crystal) on an existing crystal, information about the crystal structure is transferred from the existing crystal to the growing crystal. For example, if the growing crystal has different geometries (e.g., larger or smaller lattice constants) than the existing crystal, the growing crystal may have irregularities that weaken the structure and affect electrical performance. The existing crystal can also affect the geometries of the growing crystal, at least initially. The lattice structure may become more regular as the growing crystal thickens, but irregularities can extend far from the boundary to the existing crystal. When an objective is to grow a crystal having a small thickness on an existing crystal, methods are used to avoid the transfer of crystal information from the existing crystal to the growing crystal. In this regard, in an exemplary aspect, after growing the first piezoelectric layer 106A on a first substrate (not shown in FIG. 1) and growing the first electrode 104A on an outer surface 108A, the first substrate is removed from an inner surface 109A of the first piezoelectric layer 106A, and the second piezoelectric layer 106B is grown on the inner surface 109A of the first piezoelectric layer 106A. The one or more intermediate layers 120, 122, 124 may be employed to avoid the transfer of crystal information from the first piezoelectric layer 106A and recreate the conditions under which the first piezoelectric layer 106A was grown. The intermediate layer 120 may be an amorphous layer, such as titanium nitride (TiN) formed on the first piezoelectric layer 106A to act as a buffer from the lattice structure of the crystal that forms the first piezoelectric layer 106A. The intermediate layer 122 may be further employed on the intermediate layer 120 to more closely create an amorphous layer on which the first piezoelectric layer 106A was grown, as discussed below. For example, the intermediate layer 122 may be a layer of amorphous $SiO_2$. The intermediate layer 124 is a seed layer provided on the intermediate layer 122 to establish a particular crystal orientation (and polarization) of the second piezoelectric layer 106B. Growing the second piezoelectric layer 106B on the first piezoelectric layer 106A in this manner, a polarization of the crystal of the second piezoelectric layer 106B may be opposite to the polarization of the crystal of the first piezoelectric layer 106A.

As disclosed herein, a two-terminal BAW device 100 includes the layer stack 102, comprising a first means for receiving a first voltage $V_{IN}+$ and a second means for receiving a second voltage $V_{IN}-$. The signal voltage $V_{IN}$ is a difference between the first voltage $V_{IN}+$ and the second voltage $V_{IN}-$. The layer stack 102 includes a first crystal means having a first polarization P1 and disposed between the first means for receiving the first voltage $V_{IN}+$ and the second means for receiving the second voltage $V_{IN}-$. The layer stack 102 further comprises a second crystal means having a second polarization P2 opposite to the first polarization P1 and disposed between the first means for receiving the first voltage $V_{IN}+$ and the second means for receiving the second voltage $V_{IN}-$. A difference between the first voltage $V_{IN}+$ and the second voltage $V_{IN}-$ exciting an acoustic wave in the first crystal means and the second crystal means.

In some examples, the BAW device 100 includes the layer stack 102, comprising a first means for receiving a first voltage $V_{IN}+$ and a second means for receiving a second voltage $V_{IN}-$. The signal voltage $V_{IN}$ is a difference between the first voltage $V_{IN}+$ and the second voltage $V_{IN}-$. The BAW device 100 includes a first crystal means having a first polarization P1 and disposed between the first means for receiving the first voltage $V_{IN}+$ and the second means for receiving the second voltage $V_{IN}-$. The layer stack 102 further comprises a second crystal means having a second polarization P2 opposite to the first polarization P1 and disposed between the first means for receiving the first voltage $V_{IN}+$ and the second means for receiving the second voltage $V_{IN}-$. A difference between the first voltage $V_{IN}+$ and the second voltage $V_{IN}-$ exciting an acoustic wave in the first crystal means and the second crystal means. The layer stack 102 further comprising at least one intermediate means between the first crystal means and the second crystal means. A distance between the first crystal means and the second crystal means is less than four percent (4%) of a total thickness $T_{102}$ of the layer stack 102.

Figure 2:
FIG. 2 is a high-level flow chart of a method for fabricating the BAW device in FIG. 1.

FIG. 2 is a high-level flow chart of a method 200 for fabricating the BAW device 100 in FIG. 1. The method 200 includes forming a layer stack 102 (block 202) comprising: forming a first electrode 104A configured to couple to a first terminal (block 204), forming a second electrode 104B configured to couple to a second terminal (block 206), and forming a first piezoelectric layer 106A between the first electrode 104A and the second electrode 104B, the first piezoelectric layer 106A comprising a piezoelectric material 110 having a first crystalline structure having a first polarization P1 (block 208). Forming the layer stack 102 also includes forming a second piezoelectric layer 106B between the first piezoelectric layer 106A and the second electrode 104B, the second piezoelectric layer 106B comprising a second crystalline structure having a second polarization P2 opposite to the first polarization P1 (block 210). Optionally, in the case of the BAW device 100 in FIG. 1 comprising an SMR BAW device, the method 200 further includes forming an acoustic mirror 112 on the first electrode 104A (block 212) and coupling a target substrate 114 to the acoustic mirror 112 (block 214).

FIGS. 3A-3H are a flow chart of a method 300, further detailing the method 200 for fabricating the BAW device 100 in FIG. 1. FIGS. 4A-4H are illustrations of cross-sections of the BAW device 100 in fabrication stages 400A-400H, which correspond to the method 300. Features of the BAW device 100 that are shown in FIGS. 4A-4H are numbered the same as in FIG. 1. The dimensions (e.g., thicknesses) of the layers shown in FIGS. 4A-4H may not be drawn to scale and may be shown here as larger or smaller than the actual size relative to other features for purposes of illustration.

Figure 3A:
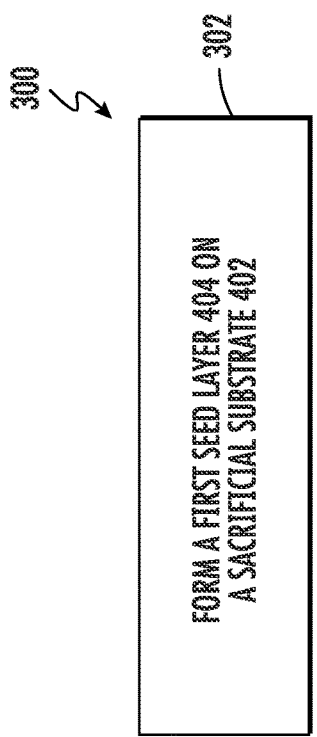
Figure 4A:
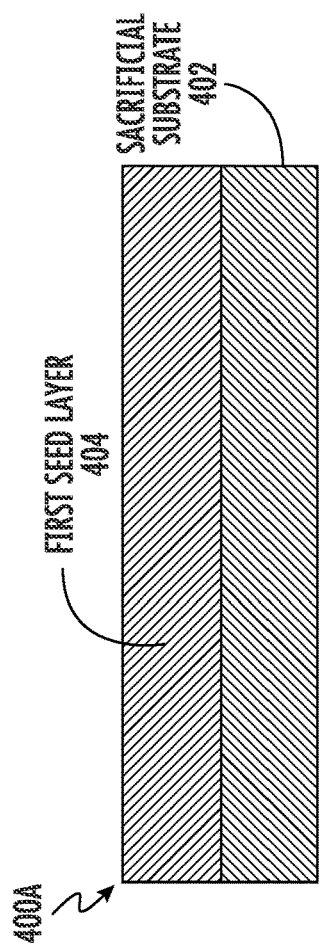

In FIG. 3A, in the method 300, forming the first piezoelectric layer 106A of the BAW device includes forming a first seed layer 404 on a sacrificial substrate 402 (block 302), as shown in FIG. 4A. The sacrificial substrate 402 may be an amorphous source substrate, such as glass, silicon, or another suitable material that may be selected for easier grinding and/or crystal structure neutrality. The first seed layer 404 may be formed of a material 406 that causes a desired crystal structure orientation (e.g., polarization) of the piezoelectric material 110 in the first piezoelectric layer 106A. Growing the first seed layer 404 to be at least about ten (10) nm thick can ensure that the inner surface 109A of the first seed layer 404 has established a uniform crystal orientation. The first seed layer 404 may be selected for having large dominating grains, which produce a self-oriented growth. For example, for a piezoelectric material 110, a material 406 of the first seed layer 404 may be aluminum nitride (AlN). Processes for forming the seed layer 404 may include sputtering, pulsed LASER deposition (PLD), and/or metal-organic chemical vapor deposition (MOCVD), for example.

Although not shown in FIG. 4A, another amorphous layer 410, which may be another amorphous material, such as $SiO_2$, may be formed on (e.g., directly on) the sacrificial substrate 402 before formation of the first seed layer 404 on (e.g., directly on) the other amorphous layer 410. As explained further below, addition of the other amorphous layer 410 simplifies removal of the sacrificial substrate 402 without damage to the first piezoelectric layer 106A. Addition of the other amorphous layer 410 also isolates the first seed layer 404 from any crystal structure information that may be transferred from the sacrificial substrate 402.

The phrases "directly on" and "in direct contact with" as used herein with reference to two layers, for example, indicate there is/are no intervening layers or other materials between the two layers.

Figure 3B:
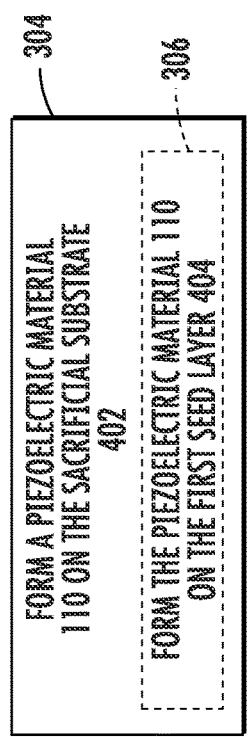
Figure 4B:
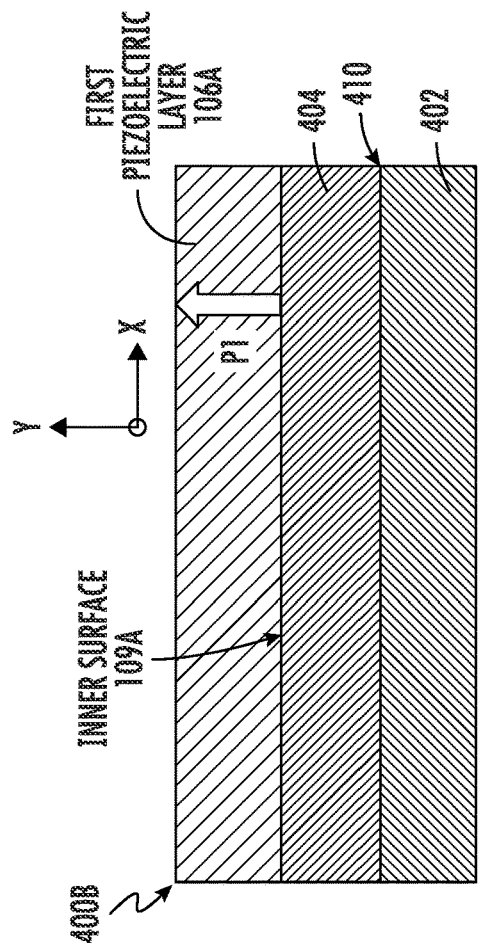

In FIG. 3B, forming the first piezoelectric layer 106A further comprises forming a piezoelectric material 110 on the sacrificial substrate 402 (block 304), which may further comprise forming the piezoelectric material 110 on the first seed layer 404 (block 306), as illustrated in fabrication stage 400B, in FIG. 4B. The piezoelectric material 110 may be grown to the thickness $T_{106A}$ in an epitaxial process directly on the first seed layer 404. Growing the piezoelectric material 110 on the first seed layer 404 produces a crystal structure with a particular polarization based on the crystal orientation information of the first seed layer 404 that is transferred to the piezoelectric material 110. For example, the crystal of the first piezoelectric layer 106A may have a polarization P1 in the Y-axis direction (e.g., perpendicular to the first seed layer 404). As shown in FIG. 4B, the Y-axis direction in this illustration is orthogonal to the first piezoelectric layer 106A.

Figure 3C:
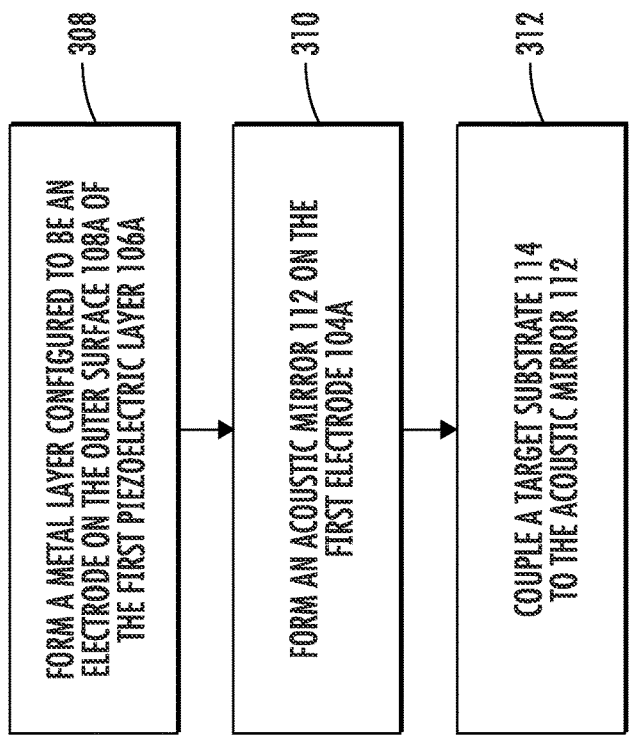
Figure 4C:
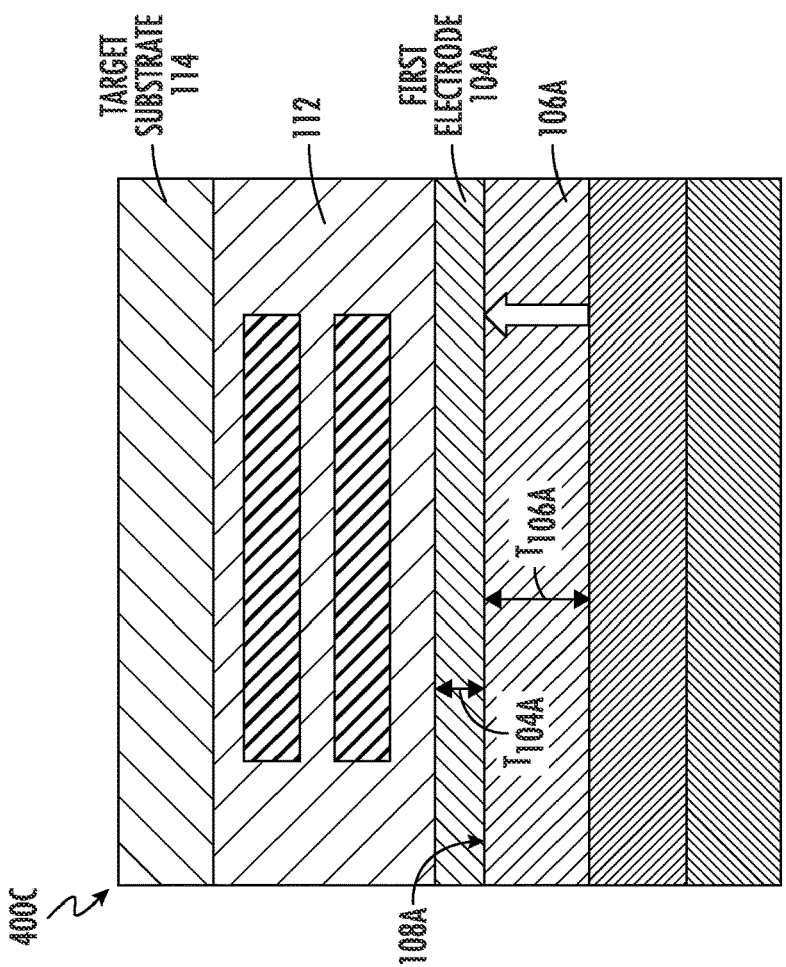

FIG. 3C includes forming the first electrode 104A comprises forming a metal layer configured to be an electrode on the outer surface 108A of the first piezoelectric layer 106A (block 308), as illustrated in fabrication stage 400C in FIG. 4C. As described above, the first electrode 104A is a layer of conductive metal (e.g., Mo) having high conductivity and a thickness $T_{104A}$ that is at least 25% of the thickness $T_{106A}$ of the first piezoelectric layer 106A. In the case of an SMR BAW device, forming the BAW device 100, further comprises the otherwise optional step of forming the acoustic mirror 112 on the first electrode 104A (block 310) and coupling a target substrate 114 to the acoustic mirror 112 (block 312). Coupling the target substrate 114 to the acoustic mirror 112 may include bonding the target substrate 114 to the acoustic mirror 112.

FIG. 3D includes an optional step of inverting the BAW device 100 for top-side processing (block 314), as shown in fabrication stage 400D in FIG. 4D. In FIG. 4D, the inversion of the BAW device 100 illustrates the transfer of handling from the sacrificial substrate 402 to the target substrate 114 to allow for top-side processing. In some examples, inverting the BAW device 100 at fabrication stage 400D may not be necessary to proceed with processing, as disclosed herein.

Figure 3E:
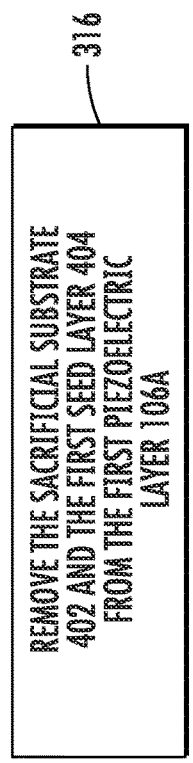
Figure 4E:
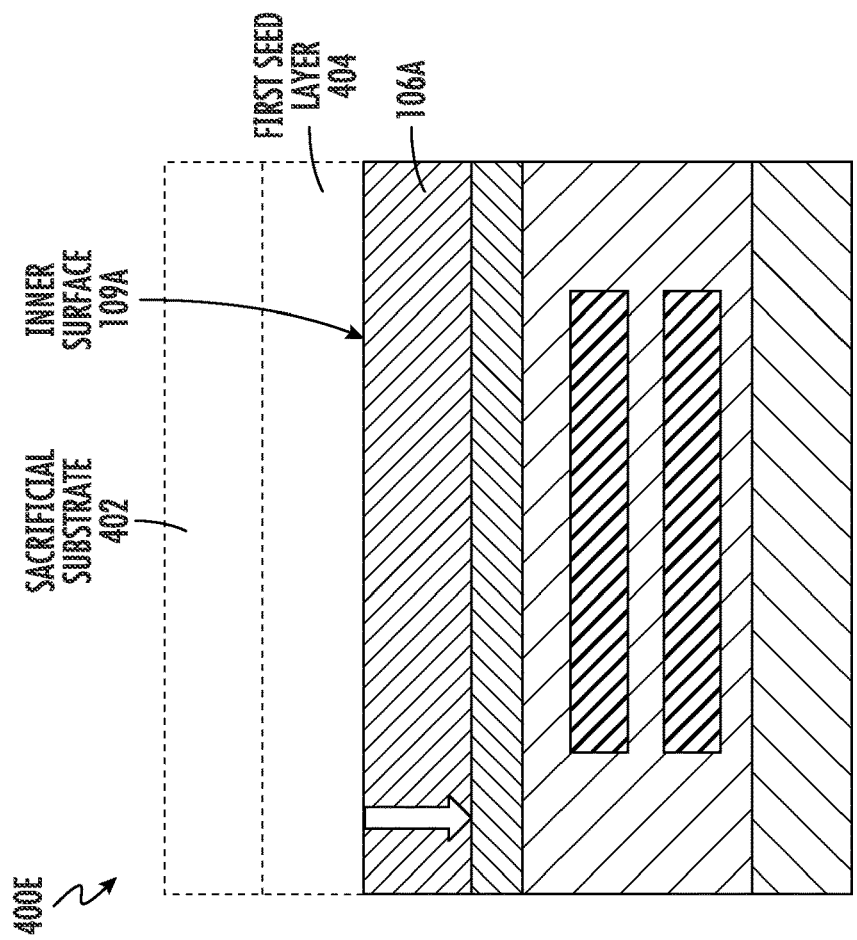

FIG. 3E shows that forming the second piezoelectric layer 106B includes removing the sacrificial substrate 402 and the first seed layer 404 from the first piezoelectric layer 106A (block 316), as illustrated in fabrication stage 400E in FIG. 4E. In the example discussed above with regard to FIG. 4A, in which another amorphous layer 410 (e.g., $SiO_2$) is formed on the sacrificial substrate 402 before the first seed layer 404 is formed on the sacrificial substrate 402, the additional amorphous layer 410 is also removed. The sacrificial substrate 402, the first seed layer 404, and the optional additional amorphous layer 410 may be removed from the first piezoelectric layer 106A by one or more of grinding, spin etching, and other suitable processes to expose an inner surface 109A of the first piezoelectric layer 106A.

FIG. 3F shows forming the second piezoelectric layer 106B further includes forming the one or more intermediate layers 120, 122, 124, as illustrated in fabrication stage 400F in FIG. 4F. In some examples, one or all of the intermediate layers 120, 122, 124 may not be needed if the second piezoelectric layer 106B (see FIG. 4G) can be grown directly on the first piezoelectric layer 106A with a polarization P2 opposite to the polarization P1 of the first piezoelectric layer 106A. In FIG. 3F, as shown in FIG. 4F, forming the second piezoelectric layer 106B includes forming the second seed layer 124 (intermediate layer 124) on the inner surface 109A of the first piezoelectric layer 106A (block 318). As previously noted, the second seed layer 124 provides an orientation for the crystal structure of the second piezoelectric layer 106B. However, in some examples, forming the second seed layer 124 directly on the inner surface 109A of the first piezoelectric layer 106A may allow the transmission of some crystal structure information from the piezoelectric material 110 in the first piezoelectric layer 106A to the second seed layer 124, and subsequently to the piezoelectric material 110 of the second piezoelectric layer 106B. Such crystal structure information may interfere with forming the second piezoelectric layer 106B with a polarization P2 opposite (e.g., in direction) to the polarization P1 of the first piezoelectric layer 106A.

Thus, for at least the purpose of reducing or avoiding the transfer of such crystal structure information, in some examples, forming the second piezoelectric layer 106B also includes forming a first amorphous layer 120 (intermediate layer 120) in direct contact with the inner surface 109A of the first piezoelectric layer 106A (block 318) and forming the second seed layer 124 on the first amorphous layer 120 (block 320). Forming the second seed layer 124 on the first amorphous layer 120 may include forming the second seed layer 124 directly on the first amorphous layer 120.

However, in some examples, it may be desirable to further isolate the second seed layer 124 from the first piezoelectric layer 106A to further reduce or avoid the transmission of crystal structure information from the first piezoelectric layer 106A to the second piezoelectric layer 106B and to more clearly replicate the conditions under which the piezoelectric material 110 of the first piezoelectric layer 106A was formed. Therefore, in the examples noted above, in which an additional amorphous layer 410 was formed on the sacrificial substrate 402 before the formation of the first seed layer 404, the intermediate layer 122 is a second amorphous layer included on the first amorphous layer 120 before the second seed layer 124 is formed. Thus, forming the second piezoelectric layer 106B in FIG. 3F may also include forming the second amorphous layer 122 in direct contact with the first amorphous layer 120 and forming the second seed layer 124 in direct contact with the second amorphous seed layer 122 (block 322). In addition, in some examples, forming the first amorphous layer 120, the second amorphous layer 122, and the second seed layer 124 further includes forming the first amorphous layer 120, the second amorphous layer 122, and the second seed layer 124 to have a total combined thickness less than four percent (4%) of a total thickness of the layer stack 102.

Figure 3G:
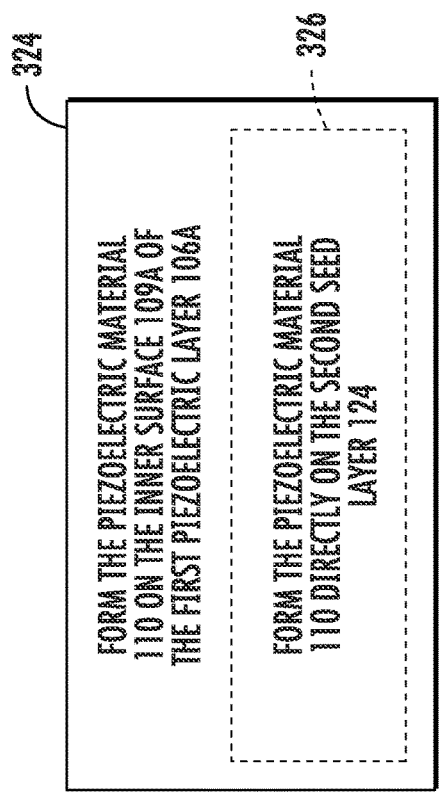
Figure 4G:
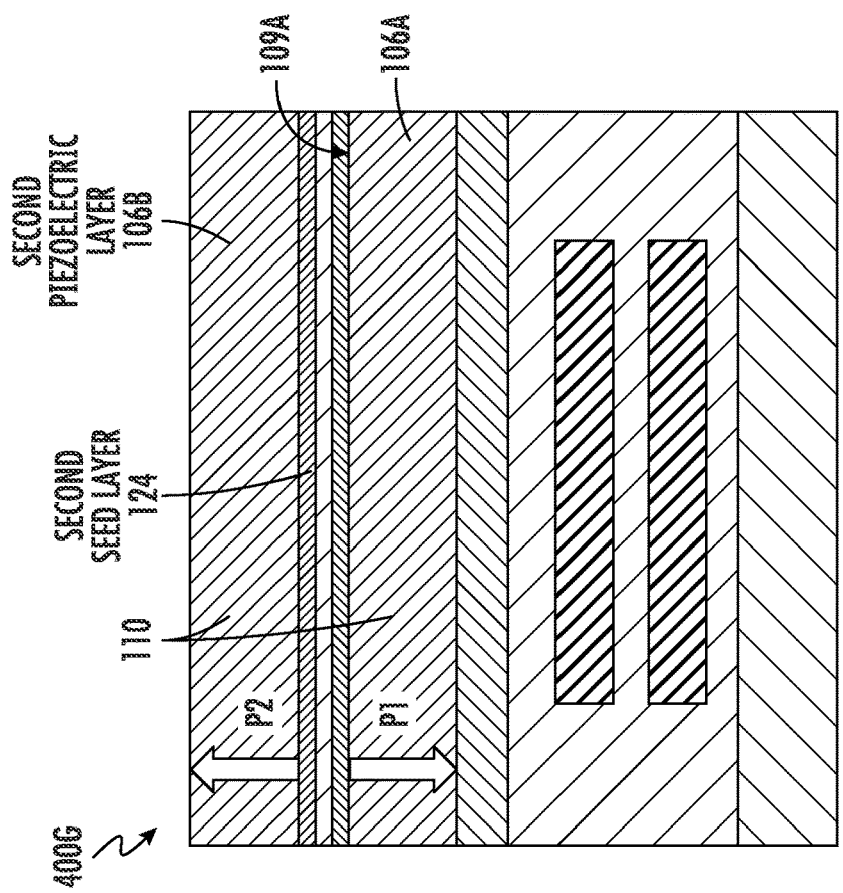

In FIG. 3G, as illustrated in fabrication stage 400G in FIG. 4G, forming the second piezoelectric layer 106B comprises forming the piezoelectric material 110 on the inner surface 109A of the first piezoelectric layer 106A (324), which further includes forming the piezoelectric material 110 directly on the second seed layer 124 (block 326). The piezoelectric material 110 of the second piezoelectric layer 106B is grown on the second seed layer 124 with a polarization P2 that is opposite to the polarization P1 of the first piezoelectric layer 106A. The conditions for growing the piezoelectric material 110 of the first piezoelectric layer 106A on the first seed layer 404 are replicated for growing the piezoelectric material 110 of the second piezoelectric layer 106B on the second seed layer 124. In this manner, the crystal structures of the first piezoelectric layer 106A and the second piezoelectric layer 106B are made as similar as possible. The second piezoelectric layer 106B is grown on the inner surface 109A of the first piezoelectric layer 106A, which is the back side of the first piezoelectric layer 106A and which is exposed by inversion in a layer transfer of the first piezoelectric layer 106A from the first substrate to the target substrate 114. Growing the piezoelectric material 110 of the second piezoelectric layer 106B on the inner surface 109A (i.e., back side) of the first piezoelectric layer 106A causes the piezoelectric material 110 of the second piezoelectric layer 106B to grow with a polarization opposite to the first piezoelectric layer 106A, which means that the polarizations P1 and P2 of the first piezoelectric layer 106A and the second piezoelectric layer 106B are opposite to each other. Thus, the crystal structures of the first piezoelectric layer 106A and the second piezoelectric layer 106B will have nearly identical but opposite reactions to an applied electric field.

In FIG. 3H, the method 300 includes forming the second electrode 104B on the second piezoelectric layer 106B (block 328), which further includes forming a second metal layer configured to be an electrode on the second piezoelectric layer 106B (block 330). The second electrode 104B and the first electrode 104A are metal layers configured to be electrodes further configured to couple to terminals. Forming the layer stack 102 according to the method 300 does not include forming, between the first piezoelectric layer 106A and the second piezoelectric layer 106B, a metal layer configured to be an electrode.

Figure 5:
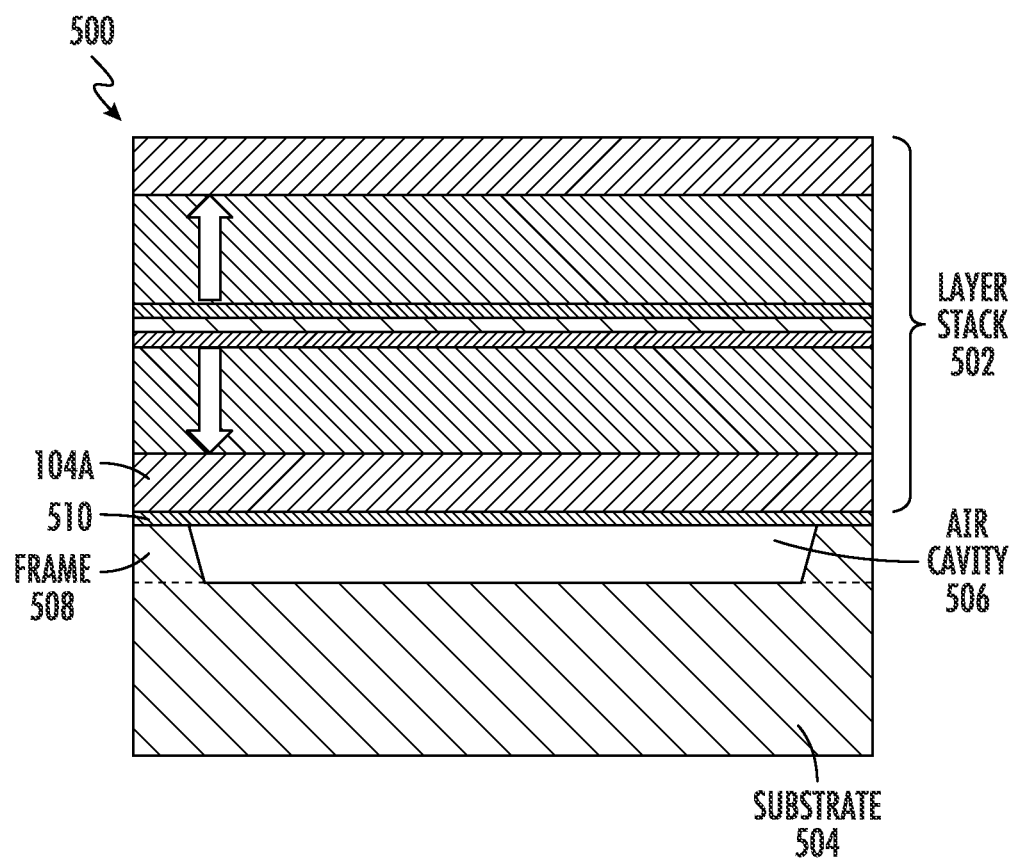
FIG. 5 is an illustration of a cross-section of the BAW device comprising the exemplary layer stack in a film bulk acoustic resonator (FBAR) example in which a layer stack includes a first piezoelectric layer and a second piezoelectric layer having opposite crystal polarization.

FIG. 5 is a cross-section of a BAW device 500, which is an example in which a layer stack 502 corresponding to the layer stack 102 of FIG. 1 is implemented as a film bulk acoustic resonator (FBAR). The BAW device 500 includes a substrate 504, which may be formed to define an air cavity 506 between the first electrode 104A and the substrate 504. Alternatively, a frame 508 may be disposed between the substrate 504 and the first electrode 104A to form the air cavity 506. In this example, a membrane 510 may be disposed between the first electrode 104A and the substrate 504, and in particular between the first electrode 104A and the air cavity 506. The layer stack 502 of the BAW device 500 is the same as the layer stack 102, which is described in detail above.

According to aspects disclosed herein, the two-terminal BAW device with a polarization of a second piezoelectric layer opposite to a polarization of a first piezoelectric layer may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
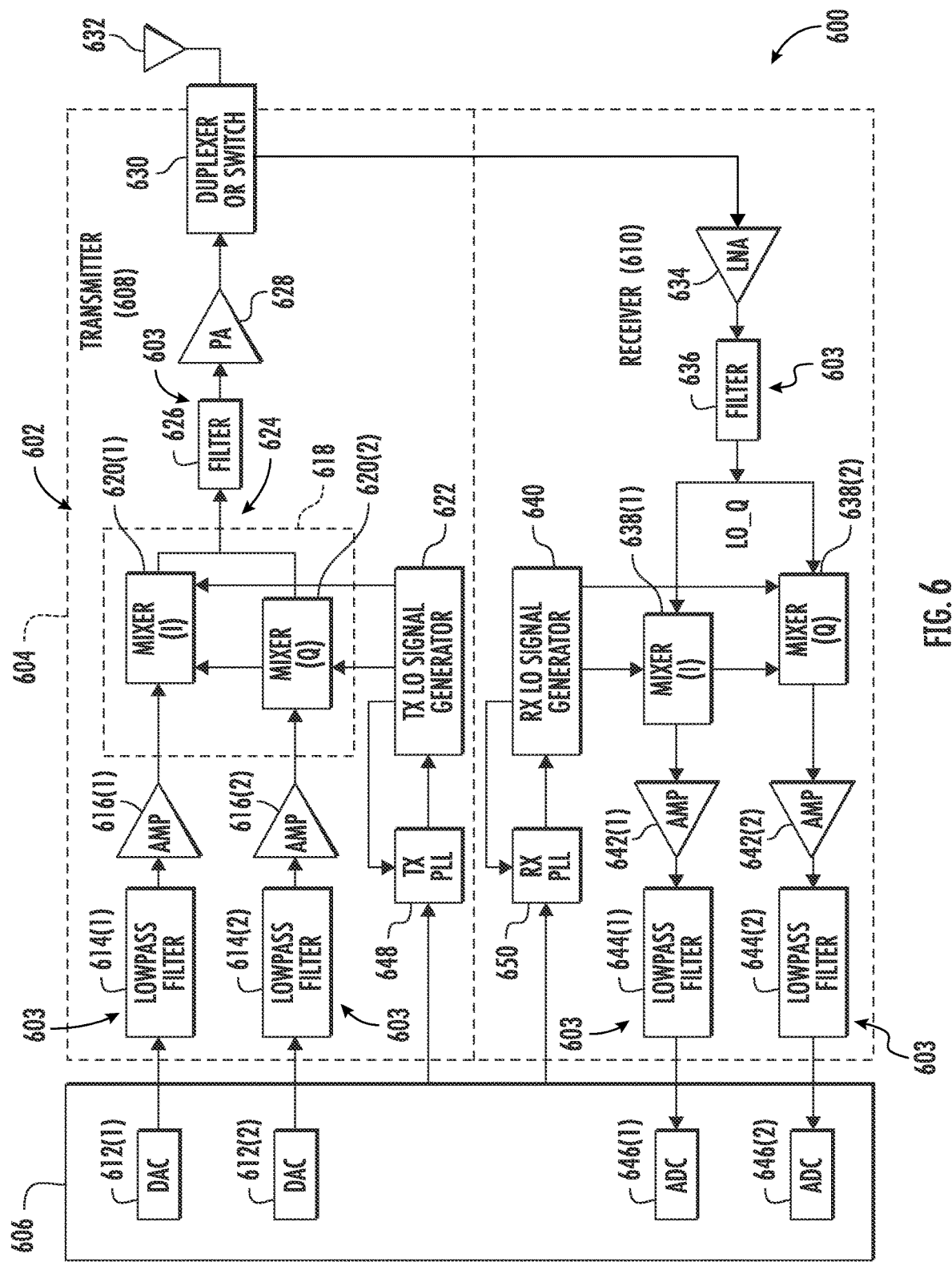
FIG. 6 is a block diagram of an exemplary wireless communications device that can include the BAW device of FIG. 1.

FIG. 6 illustrates an exemplary wireless communications device 600 that includes radio-frequency (RF) components formed from one or more integrated circuits (ICs) 602 and can include an exemplary two-terminal BAW device with a polarization of a second piezoelectric layer opposite to a polarization of a first piezoelectric layer, as illustrated in FIGS. 1 and 5, and according to any of the aspects disclosed herein. The wireless communications device 600 may include or be provided in any of the above-referenced devices as examples. As shown in FIG. 6, the wireless communications device 600 includes a transceiver 604 and a data processor 606. The data processor 606 may include a memory to store data and program codes. The transceiver 604 includes a transmitter 608 and a receiver 610 that support bi-directional communications. In general, the wireless communications device 600 may include any number of transmitters 608 and/or receivers 610 for any number of communication systems and frequency bands. All or a portion of the transceiver 604 may be implemented on one or more analog ICs, RFICs, mixed-signal ICs, etc.

The transmitter 608 or the receiver 610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into the I and Q analog output signals, e.g., I and Q output currents, for further processing.

Within the transmitter 608, lowpass filters 614(1), 614(2) filter the I and Q analog output signals, respectively, to remove undesired signals caused by the prior digital-to-analog conversion. Amplifiers (AMPs) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals from a TX LO signal generator 622 through mixers 620(1), 620(2) to provide an upconverted signal 624. A filter 626 filters the upconverted signal 624 to remove undesired signals caused by the frequency upconversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632. Any of the lowpass filters 614(1) and 614(2), or the filter 626, may be BAW filter packages 603.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Downconversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by AMPs 642(1), 642(2) and further filtered by lowpass filters 644(1), 644(2) to obtain I and Q analog input signals, which are provided to the data processor 606. Any of the filter 636 and the lowpass filters 644(1), 644(2) may be BAW filter packages 603. In this example, the data processor 606 includes analog-to-digital converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency upconversion, while the RX LO signal generator 640 generates the I and Q RX LO signals used for frequency downconversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Figure 7:
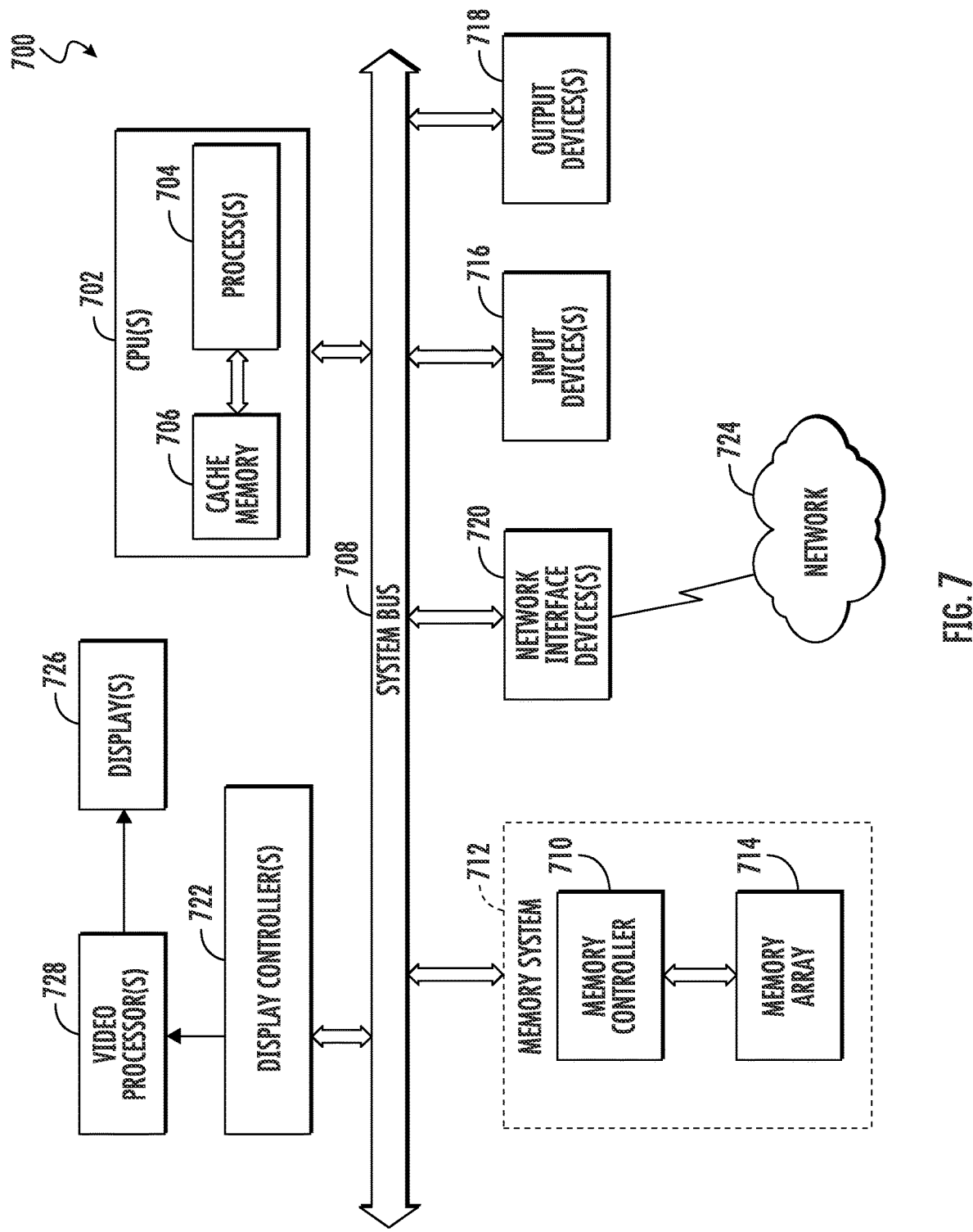
FIG. 7 is a block diagram of an exemplary processor-based system that can include the BAW device of FIG. 1.

FIG. 7 illustrates an example of a processor-based system 700 including circuits including an exemplary two-terminal BAW device with a polarization of a second piezoelectric layer opposite to a polarization of a first piezoelectric layer, as illustrated in FIGS. 1 and 5, and according to any aspects disclosed herein. In this example, the processor-based system 700 includes one or more central processor units (CPUs) 702, which may also be referred to as CPU or processor cores, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided; wherein each system bus 708 constitutes a different fabric.

Other master and slave devices can be connected to the system bus 708. As illustrated in FIG. 7, these devices can include a memory system 712 that includes the memory controller 710 and one or more memory arrays 714, one or more input devices 716, one or more output devices 718, one or more network interface devices 720, and one or more display controllers 722, as examples. The input device(s) 716 can include any type of input device, including, but not limited to, input keys, switches, voice processors, etc. The output device(s) 718 can include any type of output device, including, but not limited to, audio, video, other visual indicators, etc. The network interface device(s) 720 can be any device configured to allow an exchange of data to and from a network 724. The network 724 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 720 can be configured to support any type of communications protocol desired.

The CPU(s) 702 may also be configured to access the display controller(s) 722 over the system bus 708 to control information sent to one or more displays 726. The display controller(s) 722 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or another computer-readable medium and executed by a processor or other processing device, or combinations of both. As examples, the master and slave devices described herein may be employed in any circuit, hardware component, IC, or IC chip. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in several different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A two-terminal bulk acoustic wave (BAW) device, comprising:
    a layer stack comprising:
        a first electrode configured to couple to a first terminal;
        a second electrode configured to couple to a second terminal;
        a first piezoelectric layer between the first electrode and the second electrode, the first piezoelectric layer comprising a first crystalline structure having a first polarization; and
        a second piezoelectric layer between the first piezoelectric layer and the second electrode, the second piezoelectric layer comprising a second crystalline structure having a second polarization opposite to the first polarization.

2. The two-terminal BAW device of clause 1, wherein:
    between the first piezoelectric layer and the second piezoelectric layer, the layer stack does not comprise a metal layer configured to be an electrode.

3. The two-terminal BAW device of clause 1 or clause 2, wherein:
    the first piezoelectric layer and the second piezoelectric layer comprise a same piezoelectric material.

4. The two-terminal BAW device of any one of clause 1 to clause 3, wherein the layer stack further comprises at least one intermediate layer between the first piezoelectric layer and the second piezoelectric layer.

5. The two-terminal BAW device of clause 4, wherein the at least one intermediate layer comprises an amorphous layer comprising an amorphous material.

6. The two-terminal BAW device of clause 5, wherein the amorphous material comprises titanium nitride (TiN).

7. The two-terminal BAW device of clause 5, wherein the amorphous material comprises silicon dioxide ($SiO_2$).

8. The two-terminal BAW device of any one of clause 4 to clause 7, wherein the at least one intermediate layer comprises a seed layer configured to determine the second polarization of the second piezoelectric layer.

9. The two-terminal BAW device of clause 8, wherein:
    the second piezoelectric layer comprises aluminum scandium nitride (AlScN); and
    the seed layer comprises aluminum nitride (AlN).

10. The two-terminal BAW device of any one of clause 1 to clause 9, wherein:
    the first electrode is in direct contact with the first piezoelectric layer; and
    the second electrode is in direct contact with the second piezoelectric layer.

11. The two-terminal BAW device of any one of clause 1 to clause 10, wherein:
    the first piezoelectric layer comprises a first thickness; and
    the second piezoelectric layer comprises a second thickness in a range from 90% to 110% of the first thickness.

12. The two-terminal BAW device of any one of clause 1 to clause 11, further comprising an acoustic mirror coupled to the first electrode.

13. The two-terminal BAW device of any one of clause 1 to clause 11, further comprising:
   a substrate;
   an air cavity between the first electrode and the substrate; and
   membrane between the air cavity and the first electrode.

14. The two-terminal BAW device of any one of clause 1 to clause 13 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

15. A BAW device, comprising:
   a layer stack, comprising:
      a first electrode;
      a second electrode;
      a first piezoelectric layer between the first electrode and the second electrode, the first piezoelectric layer comprising a first crystalline structure having a first polarization;
      a second piezoelectric layer between the first piezoelectric layer and the second electrode, the second piezoelectric layer comprising a second crystalline structure having a second polarization opposite to the first polarization; and
      at least one intermediate layer between the first piezoelectric layer and the second piezoelectric layer,
   wherein a distance between the first piezoelectric layer and the second piezoelectric layer is less than four percent (4%) of a total thickness of the layer stack.

16. The BAW device of clause 15, wherein:
   the first piezoelectric layer and the second piezoelectric layer comprise a same piezoelectric material.

17. The BAW device of clause 15 or clause 16, wherein the distance between the first piezoelectric layer and the second piezoelectric layer is equal to a thickness of the at least one intermediate layer.

18. The BAW device of any one of clause 15 to clause 17, wherein the at least one intermediate layer comprises a layer of titanium nitride (TiN).

19. The BAW device of any one of clause 15 to clause 18, wherein the at least one intermediate layer comprises a layer of silicon dioxide ($SiO_2$).

20. The BAW device of any one of clause 15 to clause 19, wherein the at least one intermediate layer comprises a seed layer configured to determine the second polarization of the second piezoelectric layer.

21. The BAW device of clause 20, wherein:
   the second piezoelectric layer comprises aluminum scandium nitride (AlScN); and
   the seed layer comprises aluminum nitride (AlN).

22. The BAW device of any one of clause 15 to clause 21, further comprising an acoustic mirror coupled to the first electrode.

23. The BAW device of any one of clause 15 to clause 21, further comprising:
   a substrate;
   an air cavity between the first electrode and the substrate; and
   a membrane between the air cavity and the first electrode.

24. A method of fabricating a two-terminal BAW device, the method comprising:
   forming a layer stack comprising:
      forming a first electrode configured to couple to a first terminal;
      forming a second electrode configured to couple to a second terminal;
      forming a first piezoelectric layer between the first electrode and the second electrode, the first piezoelectric layer comprising a first crystalline structure having a first polarization; and
      forming a second piezoelectric layer between the first piezoelectric layer and the second electrode, the second piezoelectric layer comprising a second crystalline structure having a second polarization opposite to the first polarization.

25. The method of clause 24, wherein:
   forming the first piezoelectric layer comprises forming a piezoelectric material on a sacrificial substrate;
   forming the first electrode comprises forming a first metal layer configured to be an electrode on an outer surface of the first piezoelectric layer;
   forming the second piezoelectric layer comprises removing the sacrificial substrate from the first piezoelectric layer and forming the piezoelectric material on an inner surface of the first piezoelectric layer; and
   forming the second electrode comprises forming a second metal layer configured to be an electrode on the second piezoelectric layer.

26. The method of clause 25, wherein forming the first piezoelectric layer further comprises:
   forming a first seed layer on the sacrificial substrate; and
   forming the piezoelectric material on the first seed layer.

27. The method of clause 25 or clause 26, wherein forming the second piezoelectric layer further comprises:
   forming a second seed layer on the inner surface of the first piezoelectric layer; and
   forming the piezoelectric material on the second seed layer.

28. The method of clause 27, further comprising:
   forming a first amorphous layer in direct contact with the inner surface of the first piezoelectric layer; and
   forming the second seed layer on the first amorphous layer.

29. The method of clause 28, further comprising:
   forming a second amorphous layer in direct contact with the first amorphous layer; and
   forming the second seed layer in direct contact with the second amorphous layer.

30. The method of clause 29, wherein:
   forming the first amorphous layer, the second amorphous layer, and the second seed layer further comprises forming the first amorphous layer, the second amorphous layer, and the second seed layer to a total combined thickness of less than four percent (4%) of a total thickness of the layer stack.

31. The method of any one of clause 24 to clause 30, wherein:

forming the layer stack does not comprise forming, between the first piezoelectric layer and the second piezoelectric layer, a metal layer configured to be an electrode.

32. The method of any one of clause 24 to clause 31, further comprising:
   forming an acoustic mirror on the first electrode; and
   forming a target substrate on the acoustic mirror.

33. The method of any one of clause 24 to clause 31, further comprising:
   forming a membrane on the first electrode;
   forming a substrate on the first electrode; and
   forming an air cavity between the first electrode and the substrate.

34. A two-terminal bulk acoustic wave (BAW) device, comprising:
   a layer stack comprising:
      a first means for receiving a first voltage;
      a second means for receiving a second voltage;
      a first crystal means having a first polarization and disposed between the first means for receiving the first voltage and the second means for receiving the second voltage; and
      a second crystal means having a second polarization opposite to the first polarization and disposed between the first crystal means and the second means for receiving the second voltage,
      wherein a difference between the first voltage and the second voltage excites an acoustic wave in the first crystal means and the second crystal means.

35. A BAW device, comprising:
   a layer stack, comprising:
      a first means for receiving a first voltage;
      a second means for receiving a second voltage;
      a first crystal means having a first polarization and disposed between the first means for receiving the first voltage and the second means for receiving the second voltage;
      a second crystal means having a second polarization opposite to the first polarization and disposed between the first crystal means and the second means for receiving the second voltage; and
      at least one intermediate means between the first crystal means and the second crystal means,
   wherein a distance between the first crystal means and the second crystal means is less than four percent (4%) of a total thickness of the layer stack.

What is claimed is:

1. A two-terminal bulk acoustic wave (BAW) device, comprising:
   a layer stack comprising:
      a first electrode configured to couple to a first terminal;
      a second electrode configured to couple to a second terminal;
      a first piezoelectric layer between the first electrode and the second electrode, the first piezoelectric layer comprising a first crystalline structure having a first polarization;
      a second piezoelectric layer between the first piezoelectric layer and the second electrode, the second piezoelectric layer comprising a second crystalline structure having a second polarization opposite to the first polarization; and
      at least one intermediate layer between the first piezoelectric layer and the second piezoelectric layer, wherein the at least one intermediate layer comprises:
         a first amorphous layer of a first amorphous material; and
         a seed layer configured to determine the second polarization of the second piezoelectric layer.

2. The two-terminal BAW device of claim 1, wherein the at least one intermediate layer further comprises a second amorphous layer of a second amorphous material different than the first amorphous material and disposed between the first amorphous layer and the seed layer.

3. The two-terminal BAW device of claim 2, wherein the first amorphous layer is in direct contact with the first piezoelectric layer and the seed layer is in direct contact with the second piezoelectric layer.

4. The two-terminal BAW device of claim 3, wherein the second amorphous layer is in direct contact with the first amorphous layer and the seed layer.

5. The two-terminal BAW device of claim 1, wherein:
   between the first piezoelectric layer and the second piezoelectric layer, the layer stack does not comprise a metal layer configured to be an electrode.

6. The two-terminal BAW device of claim 1, wherein:
   the first piezoelectric layer and the second piezoelectric layer comprise a same piezoelectric material.

7. The two-terminal BAW device of claim 1, wherein the first amorphous material comprises titanium nitride (TiN).

8. The two-terminal BAW device of claim 1, wherein the first amorphous material comprises silicon dioxide ($SiO_2$).

9. The two-terminal BAW device of claim 1, wherein:
   the second piezoelectric layer comprises aluminum scandium nitride (AlScN); and
   the seed layer comprises aluminum nitride (AlN).

10. The two-terminal BAW device of claim 1, wherein:
    the first electrode is in direct contact with the first piezoelectric layer; and
    the second electrode is in direct contact with the second piezoelectric layer.

11. The two-terminal BAW device of claim 1, wherein:
    the first piezoelectric layer comprises a first thickness; and
    the second piezoelectric layer comprises a second thickness in a range from 90% to 110% of the first thickness.

12. The two-terminal BAW device of claim 1, further comprising an acoustic mirror coupled to the first electrode.

13. The two-terminal BAW device of claim 1, further comprising:
    a substrate;
    an air cavity between the first electrode and the substrate; and
    a membrane between the air cavity and the first electrode.

14. The two-terminal BAW device of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

15. A bulk acoustic wave (BAW) device, comprising:
a layer stack, comprising:
- a first electrode;
- a second electrode;
- a first piezoelectric layer between the first electrode and the second electrode, the first piezoelectric layer comprising a first crystalline structure having a first polarization;
- a second piezoelectric layer between the first piezoelectric layer and the second electrode, the second piezoelectric layer comprising a second crystalline structure having a second polarization opposite to the first polarization; and
- at least one intermediate layer between the first piezoelectric layer and the second piezoelectric layer, wherein:
- a distance between the first piezoelectric layer and the second piezoelectric layer is less than four percent (4%) of a total thickness of the layer stack; and
- the at least one intermediate layer comprises:
  - a first amorphous layer of a first amorphous material; and
  - a seed layer configured to determine the second polarization of the second piezoelectric layer.

16. The BAW device of claim 15, wherein:
the first piezoelectric layer and the second piezoelectric layer comprise a same piezoelectric material.

17. The BAW device of claim 15, wherein the distance between the first piezoelectric layer and the second piezoelectric layer is equal to a thickness of the at least one intermediate layer.

18. The BAW device of claim 15, wherein the first amorphous layer comprises a layer of titanium nitride (TiN).

19. The BAW device of claim 15, wherein the first amorphous layer comprises a layer of silicon dioxide ($SiO_2$).

20. The BAW device of claim 15, wherein:
the second piezoelectric layer comprises aluminum scandium nitride (AlScN); and
the seed layer comprises aluminum nitride (AlN).

21. The BAW device of claim 15, further comprising an acoustic mirror coupled to the first electrode.

22. The BAW device of claim 15, further comprising:
a substrate;
an air cavity between the first electrode and the substrate; and
a membrane between the air cavity and the first electrode.

23. A method of fabricating a two-terminal bulk acoustic wave (BAW) device, the method comprising:
forming a layer stack comprising:
- forming a first electrode configured to couple to a first terminal;
- forming a second electrode configured to couple to a second terminal;
- forming a first piezoelectric layer between the first electrode and the second electrode, the first piezoelectric layer comprising a first crystalline structure having a first polarization;
- forming a second piezoelectric layer between the first piezoelectric layer and the second electrode, the second piezoelectric layer comprising a second crystalline structure having a second polarization opposite to the first polarization; and
- forming at least one intermediate layer between the first piezoelectric layer and the second piezoelectric layer, wherein the at least one intermediate layer comprises:
  - a first amorphous layer of a first amorphous material; and
  - a seed layer configured to determine the second polarization of the second piezoelectric layer.

24. The method of claim 23, wherein:
forming the first piezoelectric layer comprises forming a piezoelectric material on a sacrificial substrate;
forming the first electrode comprises forming a first metal layer configured to be an electrode on an outer surface of the first piezoelectric layer;
forming the second piezoelectric layer comprises removing the sacrificial substrate from the first piezoelectric layer and forming the piezoelectric material on an inner surface of the first piezoelectric layer; and
forming the second electrode comprises forming a second metal layer configured to be an electrode on the second piezoelectric layer.

25. The method of claim 24, wherein forming the second piezoelectric layer further comprises:
forming a second seed layer on the inner surface of the first piezoelectric layer; and
forming the piezoelectric material on the second seed layer.

26. The method of claim 25, further comprising:
forming a first amorphous layer in direct contact with the inner surface of the first piezoelectric layer; and
forming the second seed layer on the first amorphous layer.

27. The method of claim 26, further comprising:
forming a second amorphous layer in direct contact with the first amorphous layer; and
forming the second seed layer in direct contact with the second amorphous layer.

28. The method of claim 27, wherein:
forming the first amorphous layer, the second amorphous layer, and the second seed layer further comprises forming the first amorphous layer, the second amorphous layer, and the second seed layer to a total combined thickness of less than four percent (4%) of a total thickness of the layer stack.

29. The method of claim 23, wherein:
forming the layer stack does not comprise forming, between the first piezoelectric layer and the second piezoelectric layer, a metal layer configured to be an electrode.

30. The method of claim 23, further comprising:
forming an acoustic mirror on the first electrode; and
forming a target substrate on the acoustic mirror.

31. The method of claim 23, further comprising:
forming a membrane on the first electrode;
forming a substrate on the first electrode; and
forming an air cavity between the first electrode and the substrate.

32. The method of claim 24, wherein forming the first piezoelectric layer further comprises:
forming a first seed layer on the sacrificial substrate; and
forming the piezoelectric material on the first seed layer.

* * * * *